(12) United States Patent
Yamasaki et al.

(10) Patent No.: US 7,728,601 B2
(45) Date of Patent: Jun. 1, 2010

(54) METHOD OF INSPECTING ELECTRONIC CIRCUIT

(75) Inventors: Masashi Yamasaki, Nagoya (JP); Hideki Kabune, Nagoya (JP); Toshiro Nishimura, Kariya (JP)

(73) Assignee: DENSO CORPORATION, Kariya (JP)

( * ) Notice: Subject to any disclaimer, the term of this patent is extended or adjusted under 35 U.S.C. 154(b) by 1042 days.

(21) Appl. No.: 11/439,970

(22) Filed: May 25, 2006

(65) Prior Publication Data

US 2006/0270069 A1 Nov. 30, 2006

(30) Foreign Application Priority Data

May 26, 2005 (JP) ............................... 2005-153838

(51) Int. Cl.
G01R 31/02 (2006.01)
G01R 31/26 (2006.01)
G06F 11/00 (2006.01)

(52) U.S. Cl. ...................... 324/522; 324/537; 324/769; 714/735; 714/745

(58) Field of Classification Search ................. 324/522; 714/745
See application file for complete search history.

(56) References Cited

U.S. PATENT DOCUMENTS 4,553,225 A * 11/1985 Ohe ............................ 714/745
5,283,762 A * 2/1994 Fujishima ............... 365/189.09
5,416,366 A * 5/1995 Adachi ......................... 326/33
5,422,852 A * 6/1995 Houston et al. ............. 714/745
5,457,695 A * 10/1995 Houston ..................... 714/719
5,764,580 A * 6/1998 Suzuki et al. ............... 365/205
6,266,798 B1 * 7/2001 Kanazawa et al. ............. 716/4
6,359,459 B1 * 3/2002 Yoon et al. .................. 324/765
6,836,104 B2 * 12/2004 Yoshihara ................... 323/314
7,007,257 B2 * 2/2006 Tanaka .......................... 716/9
7,283,413 B2 * 10/2007 Choi et al. ................... 365/205
2004/0181730 A1 * 9/2004 Monfared et al. ........... 714/745

FOREIGN PATENT DOCUMENTS

JP  A-H05-72260  3/1993
JP  A-H05-72280  3/1993

* cited by examiner

*Primary Examiner*—Timothy J Dole
(74) *Attorney, Agent, or Firm*—Posz Law Group, PLC

(57) ABSTRACT

A method of inspecting an electronic circuit that includes a first integrated circuit and a second integrated circuit formed on a circuit board. The first integrated circuit has a first power source, and an input circuit that has a test signal output section and the second integrated circuit has a second power source and an output circuit that has a signal input section. The method includes steps of: turning on the first and second power sources at prescribed voltage levels; changing voltage level of the first power source; applying a test signal to the signal input section of the second integrated circuit; detecting an output signal of the signal output section of the first integrated circuit; and examining whether there is a sufficient margin in the electronic circuit by comparing the test signal and the output signal.

7 Claims, 10 Drawing Sheets

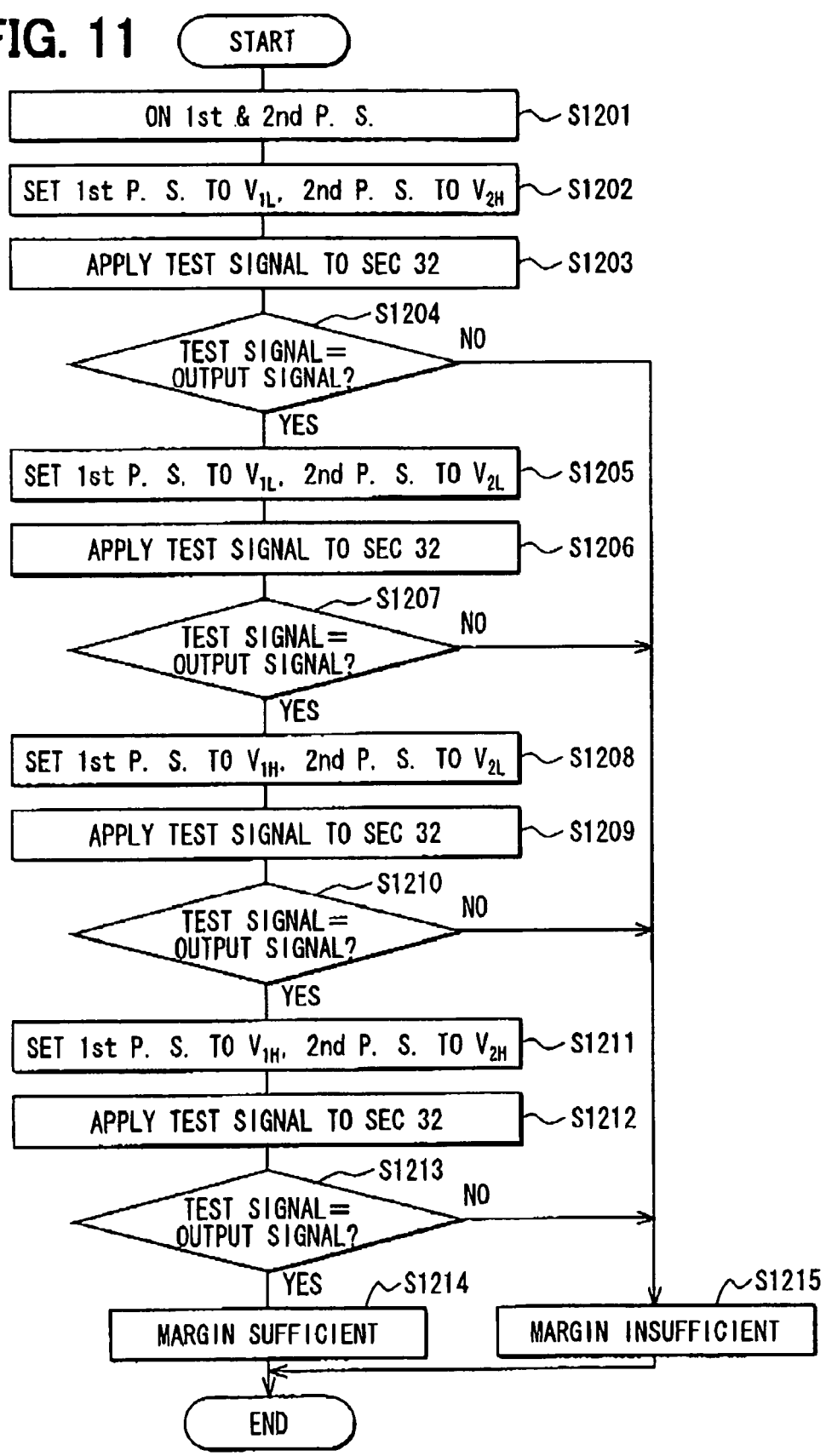

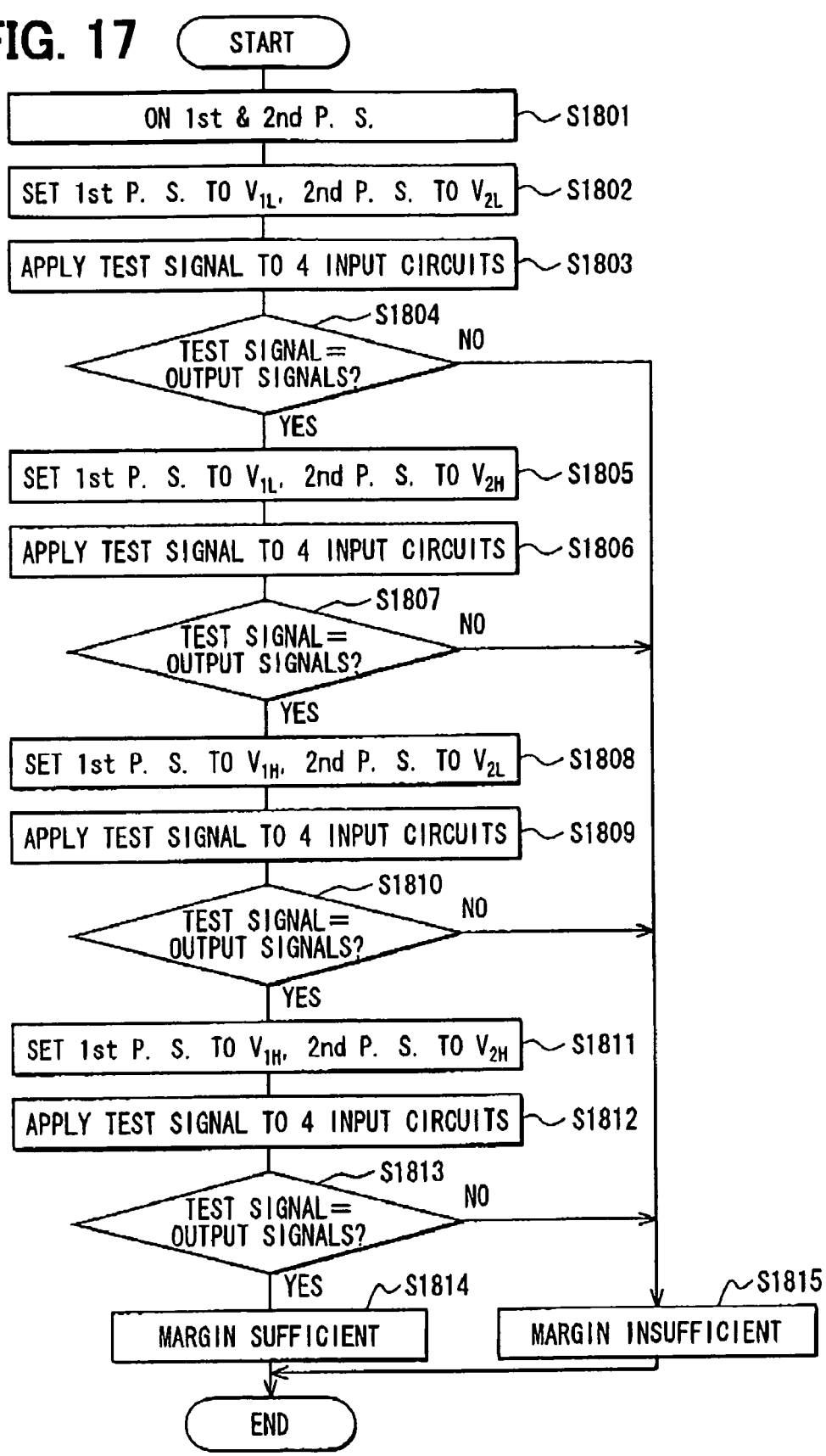

METHOD OF INSPECTING ELECTRONIC CIRCUIT

CROSS REFERENCE TO RELATED APPLICATION

The present application is based on and claims priority from Japanese Patent Application 2005-153838, filed May 26, 2005, the contents of which are incorporated herein by reference.

BACKGROUND OF THE INVENTION

1. Field of the Invention

The present invention relates to a method of inspecting an electronic circuit including an integrated circuit.

2. Description of the Related Art

Most electric and electronic circuits include an integrated circuit therein. Usually, the integrated circuit is packaged in a resinous case with a plurality of conductive pins projecting from the case. The size of the integrated circuit and the intervals between the pins have been made suitable for a quality inspection to be made without difficulty.

However, as demand for increasing the performance of the integrated circuit has become stronger, the size of the integrated circuit and the intervals between the pins have been decreased.

There is, so called, a margin test in the quality inspection. The margin test is to examine the on-off operation of the integrated circuit while a certain electric voltage is applied to one or more of the pins by an inspection probe. As the intervals between the pins become shorter, it is more difficult to bring the inspection probe in contact with the pins.

In order to solve the above problem, JP-A-5-72280 proposes inspection lands formed on a circuit board to make the margin test after the integrated circuit is mounted on the board. However, because such inspection lands necessitate an additional test space in the circuit board besides the mounting space, it does not help to decrease the size of the electronic circuit.

SUMMARY OF THE INVENTION

Therefore, an object of the invention is to enable the margin test without providing an additional test space.

According to a main feature of the invention, a method of inspecting an electronic circuit including a first integrated circuit and a second integrated circuit formed on a circuit board, in which the first integrated circuit has a first power source, an input circuit and a signal output section, and the second integrated circuit has a second power source, an output circuit and a signal input section, includes the following steps: changing voltage level of the first power source; applying a test signal to the signal input section; detecting an output signal of the signal output section; and examining whether there is a sufficient margin in the electronic circuit by comparing the test signal and the output signal.

With the above method, the margin test of an electronic circuit mounted on a circuit board can be carried out without additional test space.

It is preferable to further include a step of changing voltage level of the second power source before applying a test signal to the signal input section. This enables to examine the operation of the first integrated circuit when the second power source changes its voltage level.

In the above method of inspection, it is preferable that the voltage level is changed within a range between a maximum assurance voltage and a minimum assurance voltage. The margin is determined sufficient if the result of comparing the test signal and the output signal is within a preset value as far as the voltage levels of the first and the second power sources are set within the range between the minimum assurance voltage and the maximum assurance voltage.

According to another feature of the invention, a method of inspecting an electronic circuit including a first integrated circuit and a second integrated circuit formed on a circuit board, in which the first integrated circuit having a first power source, an input circuit and a signal output section, and the second integrated circuit having a second power source, an output circuit and a signal input section, includes the following step: turning on the first and second power source; setting the voltage levels of the first and the second power source respectively to a minimum assurance voltage $V_{1L}$ and a maximum assurance voltage $V_{2H}$; applying a test signal to the signal input section; detecting an output signal of the signal output section; examining whether the test signal and the output signal is the same or not; and determining there is not a sufficient margin if the test signal and the output signal is not the same.

The above method may further include the following steps: setting the voltage levels of the first and the second power source respectively to a maximum assurance voltage $V_{1H}$ and a minimum assurance voltage $V_{2L}$; applying a test signal to the signal input section; detecting an output signal of the signal output section; examining whether the test signal and the output signal is the same or not; and determining there is a sufficient margin if the test signal and the output signal is the same.

According to another feature of the invention, a method of inspecting an electronic circuit including a first integrated circuit and a second integrated circuit formed on a circuit board, in which the first integrated circuit has a first power source, a plurality of input circuits and their signal output sections, and the second integrated circuit has a second power source, a plurality of output circuits and their signal input sections, includes the following steps: turning on the first and second power source; setting the voltage levels of the first and the second power source respectively to a minimum assurance voltage $V_{1L}$ and a minimum assurance voltage $V_{2L}$; applying a test signal to the signal input sections; detecting output signals of the signal output sections; examining whether the test signal and the output signals are the same or not; determining there is not a sufficient margin if the test signal and the output signals are not the same; setting the voltage levels of the first and the second power source respectively to the minimum assurance voltage $V_{1L}$ and a maximum assurance voltage $V_{2H}$; applying a test signal to the signal input sections; detecting the output signals of the signal output sections; examining whether the test signal and the output signals are the same or not; and determining there is not a sufficient margin if the test signal and the output signals are not the same; setting the voltage levels of the first and the second power source respectively to a maximum assurance voltage $V_{1H}$ and the minimum assurance voltage $V_{2L}$; applying the test signal to the signal input sections; detecting the output signals of the signal output sections; examining whether the test signal and the output signals are the same or not; and determining there is not a sufficient margin if the test signal and the output signals are not the same; setting the voltage levels of the first and the second power source respectively to the maximum assurance voltage $V_{1H}$ and the maximum assurance voltage $V_{2H}$; applying the test signal to the signal input sections; detecting the output signals of the signal output sections; examining whether the test signal and the output signals are the same or not; and determining there is not a sufficient margin if the test signal and the output signals are not the same or there is a sufficient margin if the test signal and the output signals are the same.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

FIG. 11 is a flow diagram of a method of inspection the electronic circuit formed on a circuit board according to the sixth embodiment;

FIG. 17 is a flow diagram of a method of inspection the electronic circuit formed on a circuit board according to the seventh embodiment.

DETAILED DESCRIPTION OF THE PREFERRED EMBODIMENTS

Figure 1:
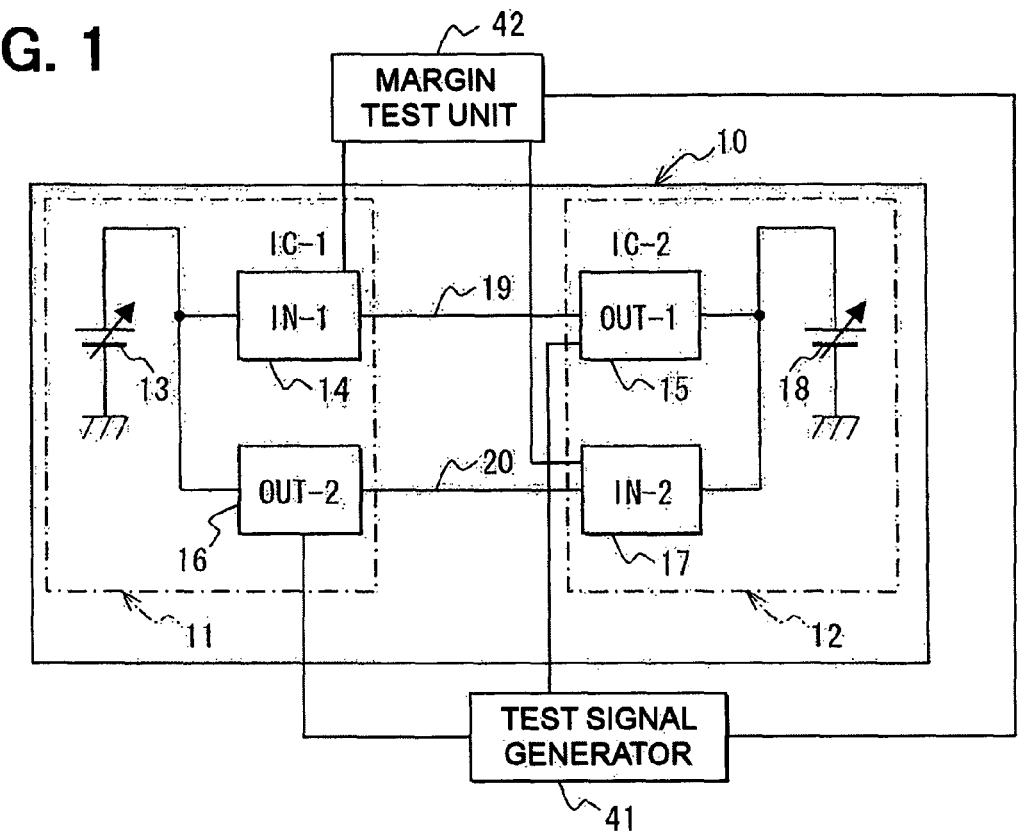
FIG. 1 is a conceptional electronic circuit formed on a circuit board according to the invention.

Firstly, a concept of the invention will be described with reference to FIG. 1. As shown in FIG. 1, a first integrated circuit (hereinafter referred to as IC-1) 11 and a second integrated circuit (hereinafter referred to as IC-2) 12 are mounted on a circuit board 10. The IC-1 11 includes a first power source 13, a first input circuit 14 and a second output circuit 16, and the IC-2 12 includes a second power source 18, a first output circuit 15 and a second input circuit 17. The voltage of the first power source 13 and the voltage of the second power source 18 can be controlled separately from each other. The first input circuit 14 of the IC-1 11 and the first output circuit 15 of the IC-2 12 are connected to each other by a first wire 19 formed on the circuit board 10, and the second output circuit 16 of the IC-1 11 and the second input circuit 17 of the IC-2 12 are connected to each other by a second wire 20 formed on the circuit board 10.

A test signal sent from a test signal generator 41 is applied to the respective output circuits 15, 16 and a margin test unit 42. The output signals of the respective input circuits 14, 17 are also inputted to the margin test unit 42. The margin test unit 42 compares the test signal and the output signals and determines that the margin of the interface is sufficient when they become equal to each other.

Here, the margin is defined by a difference between a threshold value and the output signals when the electronic circuit normally operates. The margin is deemed sufficient if the difference between the threshold value and the output signals falls within a prescribed level. The electronic circuit may include a digital circuit including a CMOS circuit and an analog circuit including an operational amplifier.

If power source voltage fluctuates, the voltage of the output signals of the electronic circuit changes. The output voltage of the first output circuit 15 is changed by changing the voltage of the second power source 18. The change in the output voltage of the first output circuit 15 changes the input voltage of the first input circuit 14 via the first wire 19. Thus, the operational margin test on the first input circuit 14 can be carried out by changing the voltage of the second power source 18.

The operational margin test on the second input circuit 17 also can be carried out by changing the voltage of the first power source 13 in the same manner as above.

An electronic circuit mounted on a circuit board according to the first embodiment will be described with reference to FIGS. 2-5. Incidentally the same reference character indicates the same or substantially the same part, portion or component hereafter.

The first input circuit 14 includes a first test signal output section 24 and a first test signal input section 25 that is connected to the first wire 19. The first output circuit 15 includes a first test signal output section 31 and a first test signal input section 32 that is connected to the first wire 19. The first test signal output sections 24 of the first input circuit 14 and the first test signal input section 32 of the first output circuit 15 will be used for normal operation thereof. The CMOS circuit 21 outputs a high level signal (hereinafter referred to Hi signal) when a low level signal (hereinafter referred to as Lo signal) is applied thereto, and a Lo signal when a Hi signal is applied thereto.

Figure 3:
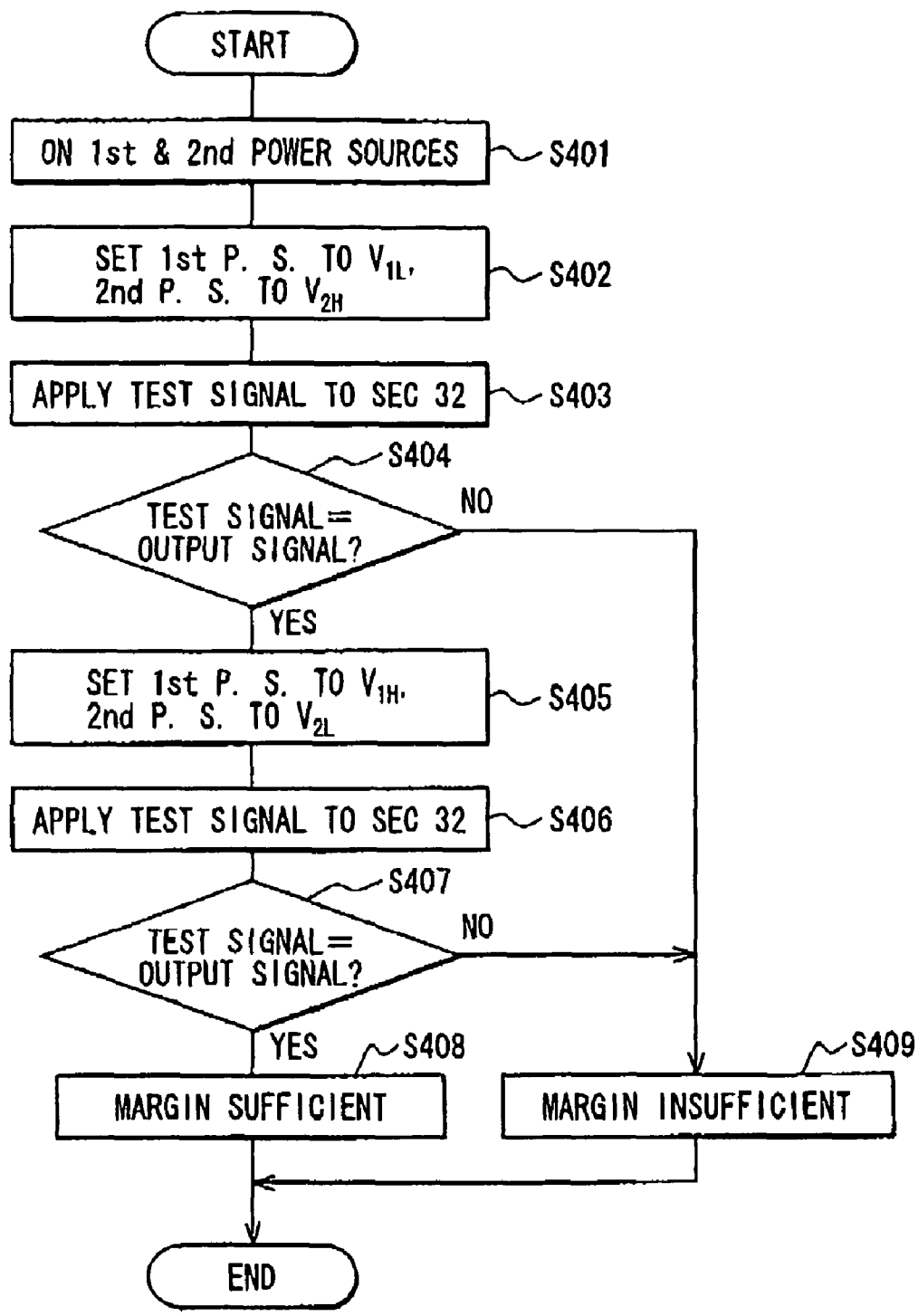
FIG. 3 is a flow diagram of a method of inspection the electronic circuit formed on a circuit board according to the first embodiment.

A margin test on the electronic circuit according to the first embodiment will be described below with reference to FIG. 3.

Figure 4:
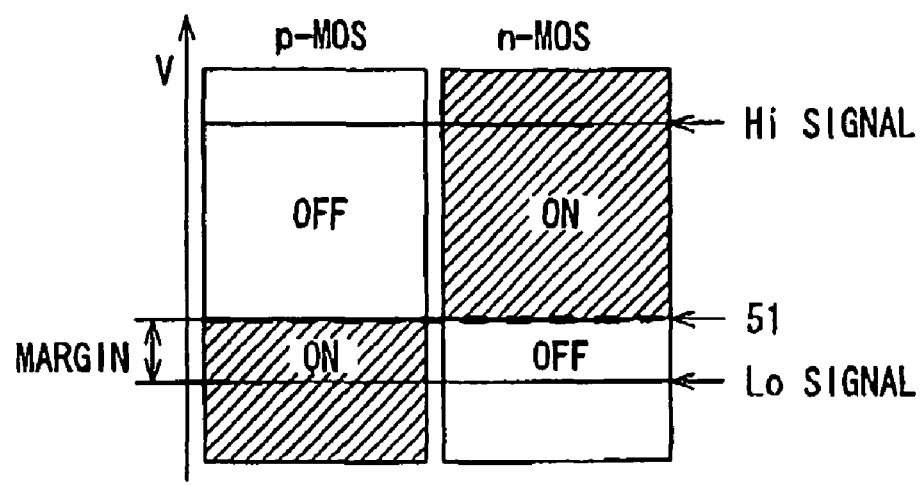
FIG. 4 is a graph showing margin test areas of the electronic circuit formed on a circuit board according to the first embodiment.
Figure 5:
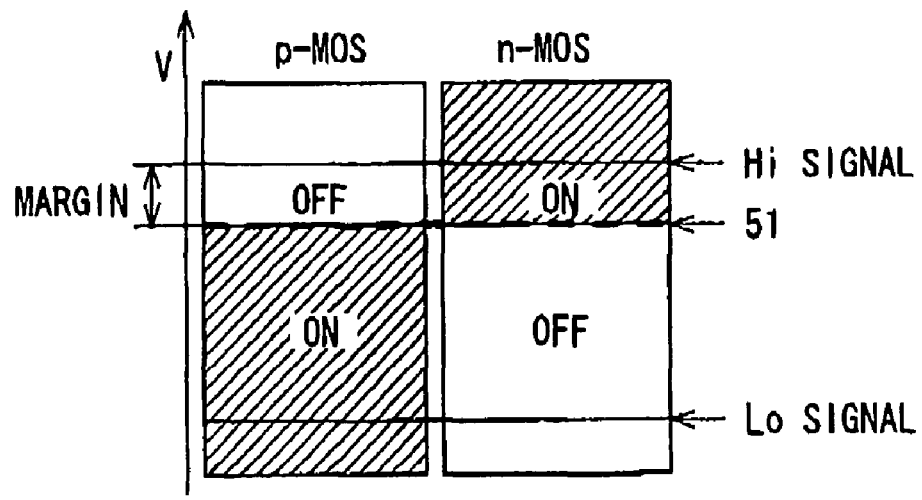
FIG. 5 is a graph showing margin test areas of the electronic circuit formed on a circuit board according to the first embodiment.

Firstly, the first and second power sources 13, 18 are turned on at (step) S401. Then, the voltages of the first and second power sources 13, 18 are respectively set to a minimum assurance voltage $V_{1L}$ of the IC-1 11 and a maximum assurance voltage $V_{2H}$ of the IC-2 12 at S402. Thereafter, a test signal which includes a Lo signal and a subsequent Hi signal is applied to the first test signal input section 32 of the first output circuit 15 at S 403. Incidentally, a Hi signal and a subsequent Lo signal, of the test signal, may be applied to the first test signal input section 32. This test signal is outputted from the first test signal output section 31 as a diagnosis signal, which is sent to the first test signal input section 25 via the first wire 19. Thereafter, at S 404, whether the output signal of the first test signal output sections 24 is or is not the same as the test signal applied to the first test signal input section 32 is examined to carry out a branch examination. As shown in FIG. 4, the branch examination examines whether or not the level of the Lo signal of the test signal is lower than an input threshold value 51 of the CMOS even when the input threshold value 51 of the CMOS is low because of a low voltage level of the first power source 13 and whether or not the level of the Hi signal of the test signal is higher than the input threshold value even when the Lo signal of the test signal is high because of a higher voltage level of the second power source 18. If the result of the examination at S404 is YES (or Y), the step goes to S 405, where the voltage of the first power source 13 is set to a maximum assurance voltage $V_{1H}$ of the IC-1 11, and the voltage of the second power source 18 is set to a minimum assurance voltage $V_{2L}$ of the IC-2 12. At the next step S406, the test signal is applied to the first test signal input section 32. At the next step S407, whether the output signal of the first test signal output section 24 is or is not the same as the test signal is examined to carry out a branch examination. As shown in FIG. 5, in the branch examination whether or not the level of the Hi signal of the test signal is higher than the input threshold value 51 of the CMOS and whether or not the level of the Lo signal of the test signal is lower than the input threshold value 51 are examined, when the input threshold value 51 of the CMOS is high because of a high voltage level of the first power source 13 or even when the Hi signal of the test signal is low because of a lower voltage level of the second power source 18.

If the result of the examination at S407 is Y, the step goes to S408, where it is determined that the margin of the interface between the IC-1 11 and IC-2 12 is sufficient.

If the result at S404 or S407 is N, on the other hand, the step goes to S409, where it is determined that the margin of the interface between the IC-1 11 and IC-2 12 is not sufficient.

Incidentally, the step S402 and the step S405 can be exchanged one with the other. The minimum and maximum assurance voltages may be replaced with other variable voltages to detect the threshold value of the CMOS circuit 21 by monitoring the output signal of the first test signal output section 24.

Figure 6:
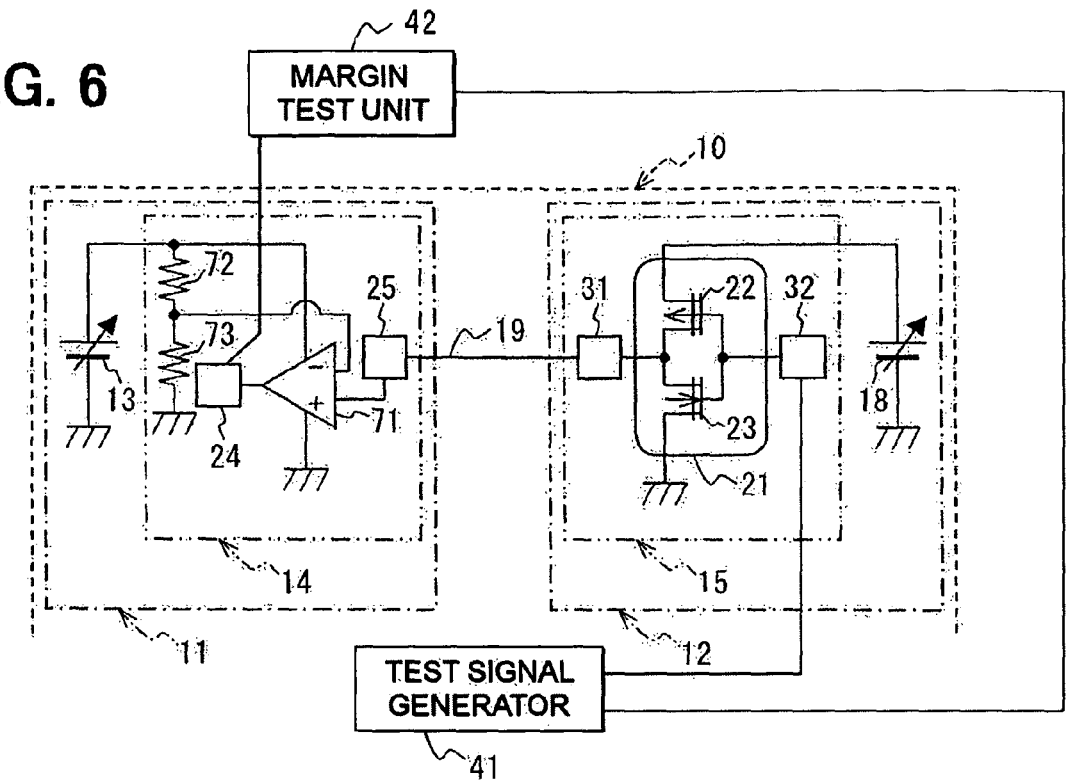
FIG. 6 is an electronic circuit formed on a circuit board according to the second embodiment of the invention.

An electronic circuit mounted on a circuit board according to the second embodiment will be described with reference to FIG. 6.

The electronic circuit according to the second embodiment is the same in structure as the electronic circuit according to the first embodiment except that the first input circuit 14 includes a comparator 71 and a voltage dividing circuit consisting of a resistor 72 and a resistor 73.

The reference voltage of the comparator 71 is a portion of the voltage of the first power source 13 provided by the voltage dividing circuit. The margin test on this embodiment can be carried out in the same manner as that described above.

Figure 7:
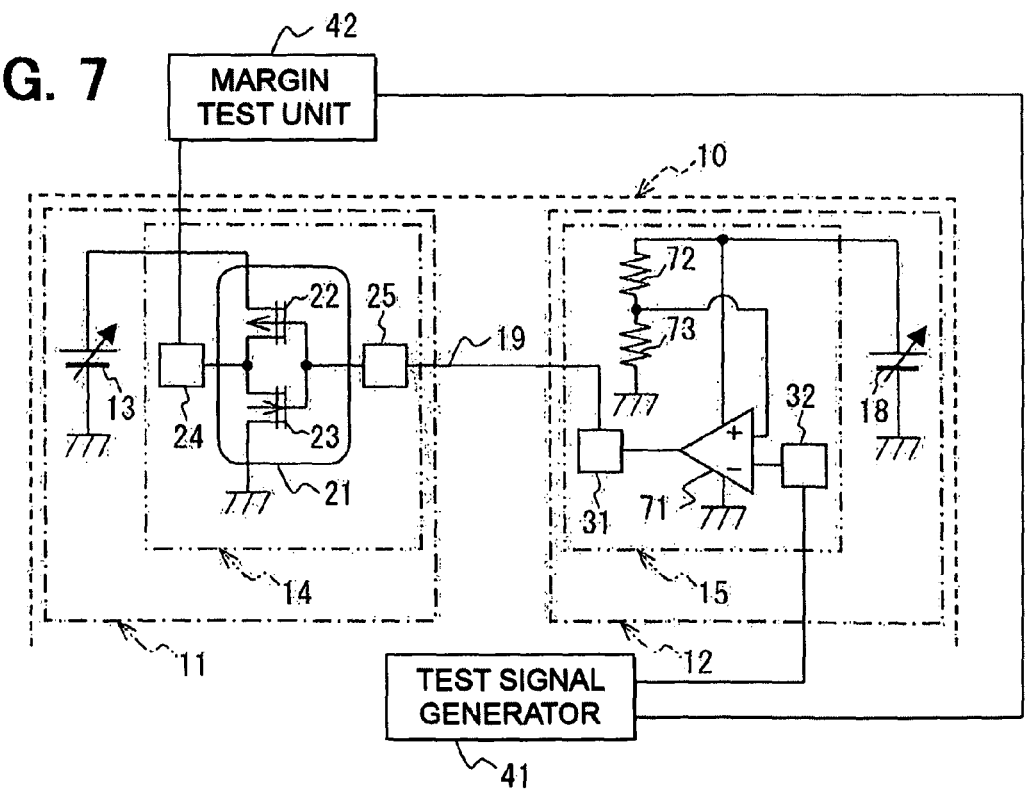
FIG. 7 is an electronic circuit formed on a circuit board according to the third embodiment of the invention.

An electronic circuit mounted on a circuit board according to the third embodiment will be described with reference to FIG. 7.

The electronic circuit according to the third embodiment is the same in structure as the electronic circuit according to the first embodiment except that the first output circuit 15 includes the comparator 71 and the voltage dividing circuit consisting of the resistor 72 and the resistor 73.

The reference voltage of the comparator 71 is a portion of the voltage of the second power source 18 provided by the voltage dividing circuit. The margin test on this embodiment can be carried out in the same manner as that described above.

Figure 8:
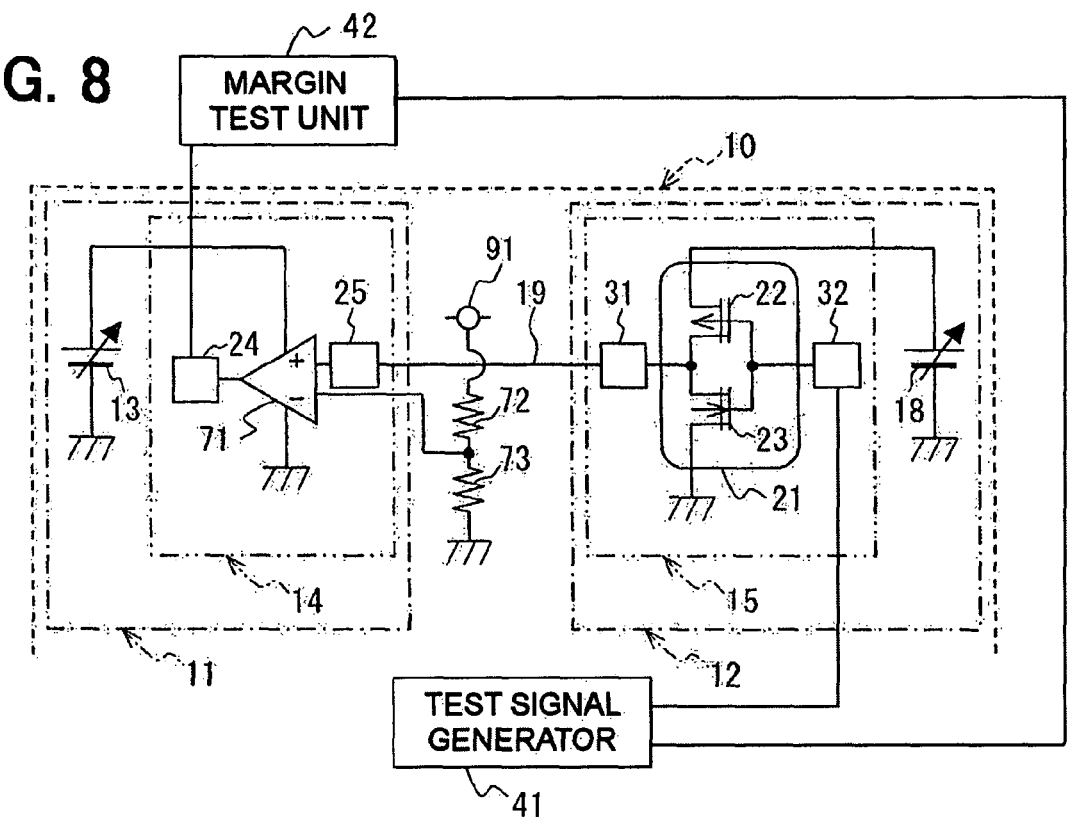
FIG. 8 is an electronic circuit formed on a circuit board according to the fourth embodiment of the invention.
Figure 9:
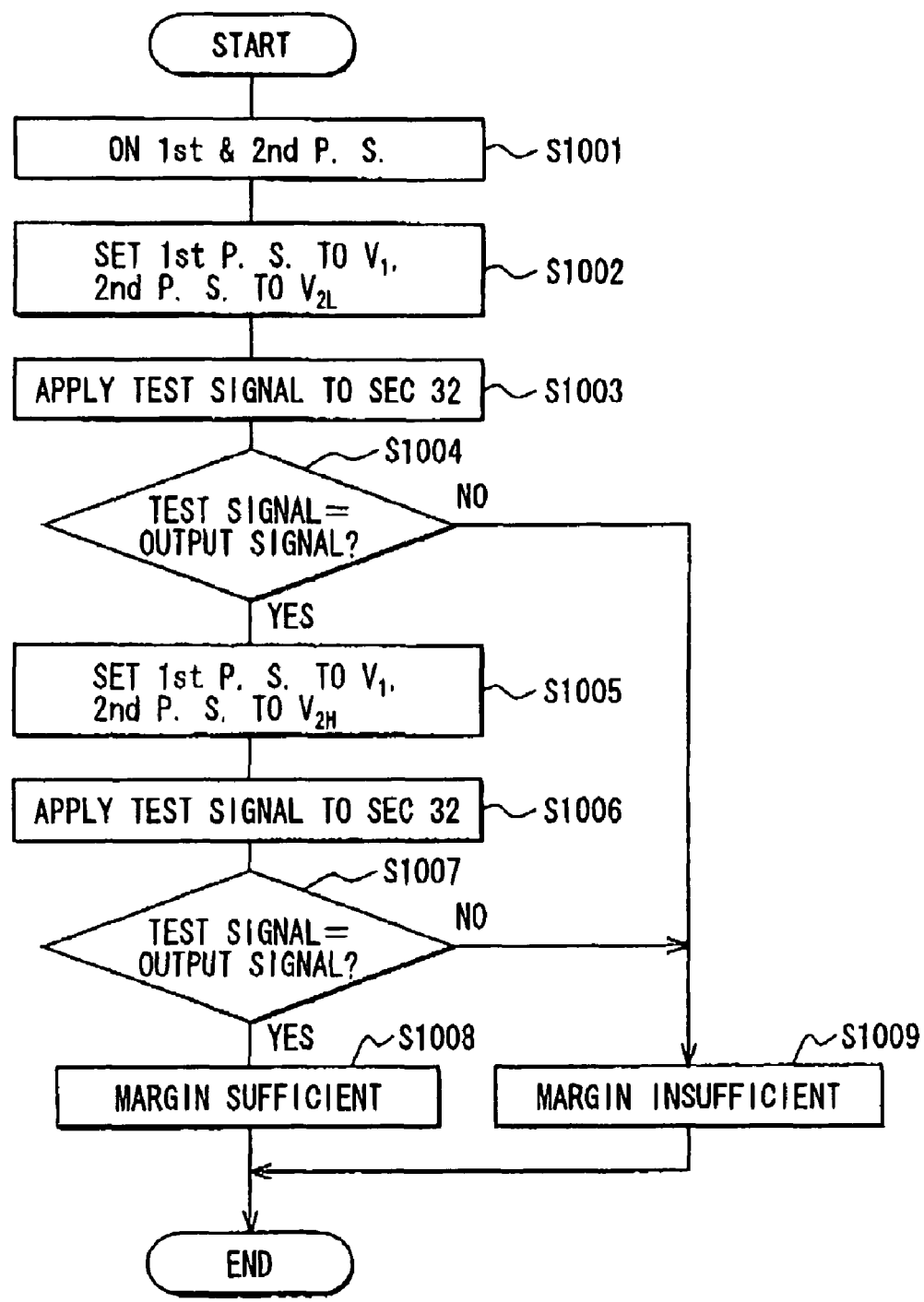
FIG. 9 is a flow diagram of a method of inspection the electronic circuit formed on a circuit board according to the fourth embodiment.

An electronic circuit mounted on a circuit board according to the fourth embodiment will be described with reference to FIGS. 8 and 9.

The electronic circuit according to the fourth embodiment is the same in structure as the electronic circuit according to the second embodiment except that the voltage dividing circuit consisting of the resistor 72 and resistor 73 is disposed outside the IC-1 11 and IC-2 12.

A margin test on the electronic circuit according to the fourth embodiment will be described below with reference to FIG. 9.

Firstly, the first and second power sources 13, 18 are turned on at S1001. Then, the voltages of the first and second power sources 13, 18 are respectively set to a voltage V1, taking the voltage of the comparator 71 at the same phase into account, and a minimum assurance voltage $V_{2L}$ at S1002. Thereafter, a test signal which includes a Hi signal and a subsequent Lo signal is applied to the first test signal input section 32 of the first output circuit 15 at S1003. Thereafter, at S1004, whether the output signal of the first test signal output sections 24 is or is not the same as the test signal applied to the first test signal input section 32 is examined to carry out a branch examination. If the result of the examination at S1004 is Y, the step goes to S1005, where the voltage of the second power source 18 is set to a maximum assurance voltage $V_{2H}$ of the IC-2 12. At the next step S1006, the test signal is applied to the first test signal input section 32. At the next step S1007, whether the output signal of the first test signal output section 24 is or is not the same as the test signal is examined to carry out a branch examination. If the result of the examination at S1007 is Y, the step goes to S1008, where it is determined that the margin of the interface between the first input circuit 14 of the IC-1 11 and the first output circuit 15 of the IC-2 12 is sufficient. If the result is N, on the other hand, the step goes to S1009, where it is determined that the margin of the interface between the first input circuit 14 of the IC-1 11 and the first output circuit 15 of the IC-2 12 is not sufficient.

Incidentally, the step S1002 and the step S1005 can be exchanged one with the other. The minimum and maximum assurance voltages may be replaced with other variable voltages to detect the threshold value of the CMOS circuit 21 by monitoring the output signal of the first test signal output section 24.

Figure 10:
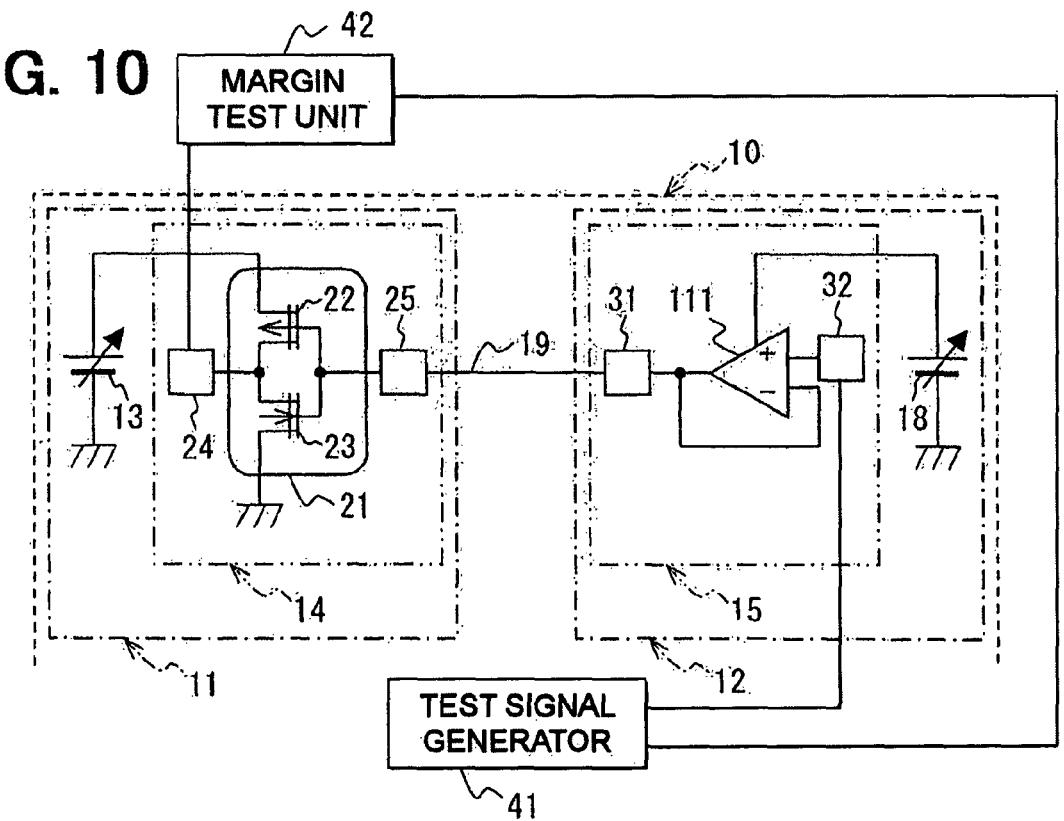
FIG. 10 is an electronic circuit formed on a circuit board according to the fifth embodiment of the invention.

An electronic circuit mounted on a circuit board according to the fifth embodiment will be described with reference to FIG. 10.

The electronic circuit according to the fifth embodiment is the same in structure as the electronic circuit according to the third embodiment except that the first output circuit 15 of the IC-2 12 has an analog amplifier 111.

The margin test on this embodiment can be carried out in the same manner as that described above.

An electronic circuit mounted on a circuit board according to the sixth embodiment will be described with reference to FIGS. 11-15.

The electronic circuit according to the sixth embodiment is the same in structure as the electronic circuit according to the first embodiment except that the CMOS circuit 21 of the first input circuit 14 of the IC-1 11 has a hysteresis that provides a lower threshold level 151 and a higher threshold level 152.

A margin test on the electronic circuit according to the sixth embodiment will be described below with reference to FIG. 11.

Figure 12:
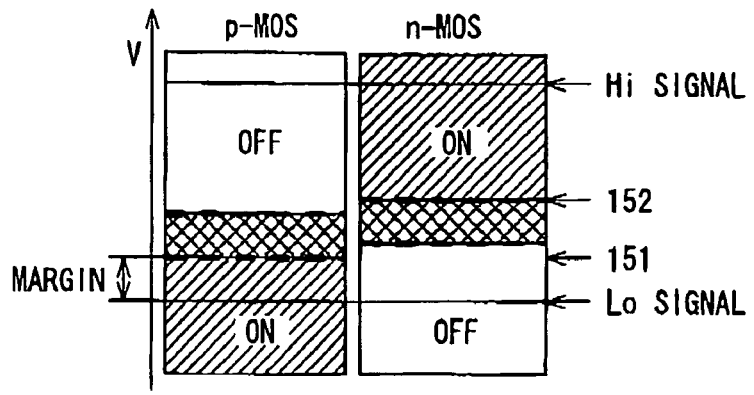
FIG. 12 is a graph showing margin test areas of the electronic circuit formed on a circuit board according to the sixth embodiment.
Figure 13:
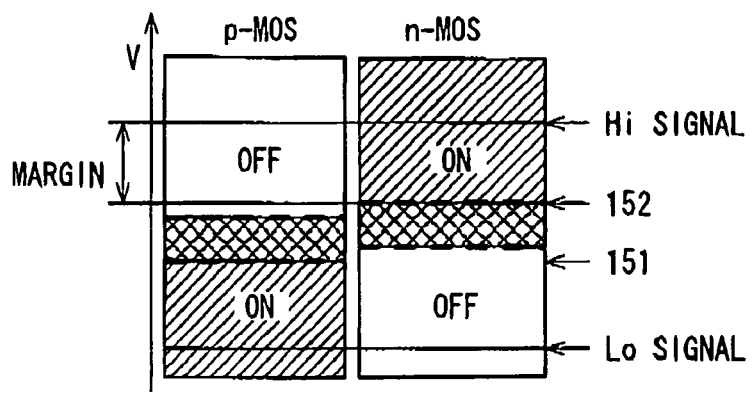
FIG. 13 is a graph showing margin test areas of the electronic circuit formed on a circuit board according to the sixth embodiment.

Firstly, the first and second power sources 13, 18 are turned on at S1201. Then, the voltages of the first and second power sources 13, 18 are respectively set to a minimum assurance voltage $V_{1L}$ of the IC-1 11 and a maximum assurance voltage $V_{2H}$ of the IC-2 at S1202. Thereafter, a test signal which includes a Lo signal and a subsequent Hi signal is applied to the first test signal input section 32 of the first output circuit 15 at S1203. This test signal is outputted from the first test signal output section 31 as a diagnosis signal, which is sent to the first test signal input section 25 via the first wire 19. Thereafter, at S1204, whether the output signal of the first test signal output sections 24 is or is not the same as the test signal applied to the first test signal input section 32 is examined to carry out a branch examination. As shown in FIG. 12, the branch examination examines whether or not the level of the Lo signal of the test signal is lower than the lower input threshold value 151 of the CMOS and the Hi signal of the test signal is higher than the higher input threshold value 152 even when the input threshold value 151 of the CMOS is low because of a low voltage level of the first power source 13 and the Lo signal of the test signal is high because of a higher voltage level of the second power source 18. If the result of the examination at S1204 is Y, the step goes to S1205, where the voltage of the first power source 13 is set to a minimum assurance voltage $V_{1L}$ of the IC-1 11, and the voltage of the second power source 18 is set to a minimum assurance voltage $V_{2L}$ of the IC-2 12. At the next step S1206, the test signal is applied to the first test signal input section 32. At the next step S1207, whether the output signal of the first test signal output section 24 is or is not the same as the test signal is examined to carry out a branch examination. As shown in FIG. 13, a branch examination of whether or not the level of the Lo signal of the test signal is lower than the lower input threshold value 151 even when the lower input threshold value 151 is low because of a lower voltage level of the first power source 13 and a branch examination of whether or not the level of the Hi signal of the test signal is higher than the higher input threshold value 152 even when the Hi signal of the test signal is low because of a lower voltage level of the second power source 18 are carried out.

Figure 14:
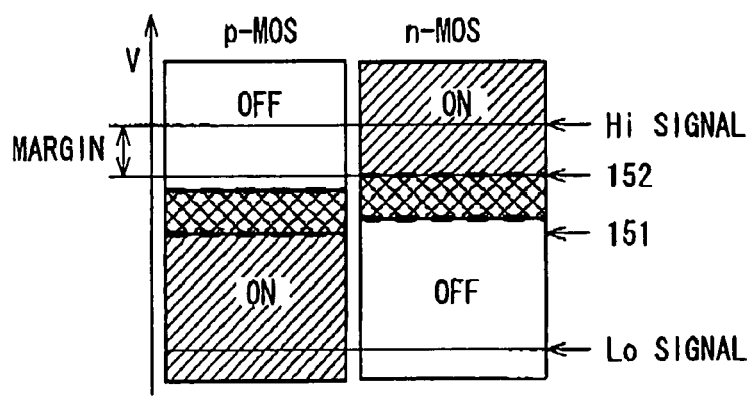
FIG. 14 is a graph showing margin test areas of the electronic circuit formed on a circuit board according to the sixth embodiment.

If the result of the examination at S1207 is Y, the step goes to S1208, where, the voltages of the first and second power sources 13, 18 are respectively set to a maximum assurance voltage $V_{1H}$ of the IC-1 11 and a minimum assurance voltage $V_{2L}$ of the IC-2. Thereafter, the test signal is applied to the first test signal input section 32 of the first output circuit 15 at S1209. Thereafter, at S1210, whether the output signal of the first test signal output sections 24 is or is not the same as the test signal is examined to carry out a branch examination. As shown in FIG. 14, the branch examination examines whether or not the level of the Lo signal of the test signal is lower than the lower input threshold value 151 of the CMOS and the Hi signal of the test signal is higher than the higher input threshold value 152 even when the higher input threshold value 152 of the CMOS is high because of a higher voltage level of the first power source 13 and the Hi signal of the test signal is low because of a lower voltage level of the second power source 18.

Figure 15:
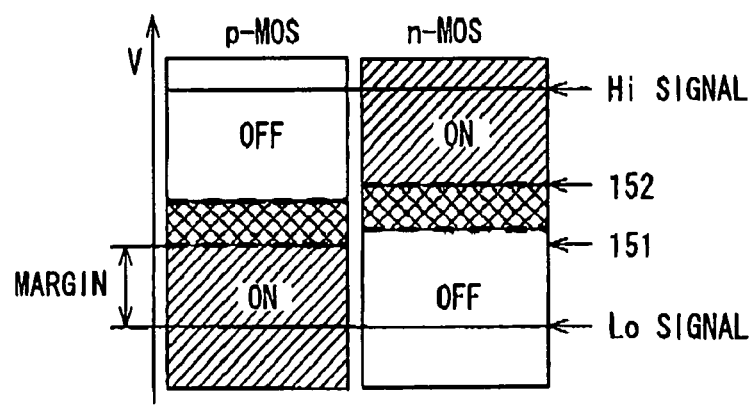
FIG. 15 is a graph showing margin test areas of the electronic circuit formed on a circuit board according to the sixth embodiment.

If the result of the examination at S1210 is Y, the step goes to S1211, where the voltage of the first power source 13 is set to a minimum assurance voltage $V_{1H}$ of the IC-1 11, and the voltage of the second power source 18 is set to a maximum assurance voltage $V_{2H}$ of the IC-2 12. At the next step S1212, the test signal is applied to the first test signal input section 32. At the next step S1213, whether the output signal of the first test signal output section 24 is or is not the same as the test signal is examined to carry out a branch examination. As shown in FIG. 15, the branch examination examines whether or not the level of the Lo signal of the test signal is lower than the lower input threshold value 151 of the CMOS and the Hi signal of the test signal is higher than the higher input threshold value 152 even when the higher input threshold value 152 of the CMOS is high because of a higher voltage level of the first power source 13 and the Lo signal of the test signal is high because of a higher voltage level of the second power source 18. If the result of the examination is Y, the step goes to S1214, where it is determined that the margin of the interface between the IC-1 11 and IC-2 12 is sufficient. If the result is N at S1202, S1204, S1207, S1210 and S1213, the step goes to S1215, where it is determined that the margin of the interface between the IC-1 11 and IC-2 12 is not sufficient.

Incidentally the order of the voltage settings in the steps S1202, S1205, S1208, S1211 can be changed one from another, and the assurance voltages can be replaced with variable voltage levels by monitoring the voltage of the first test signal output section 24 to detect the threshold value of the CMOS circuit 21.

Figure 16:
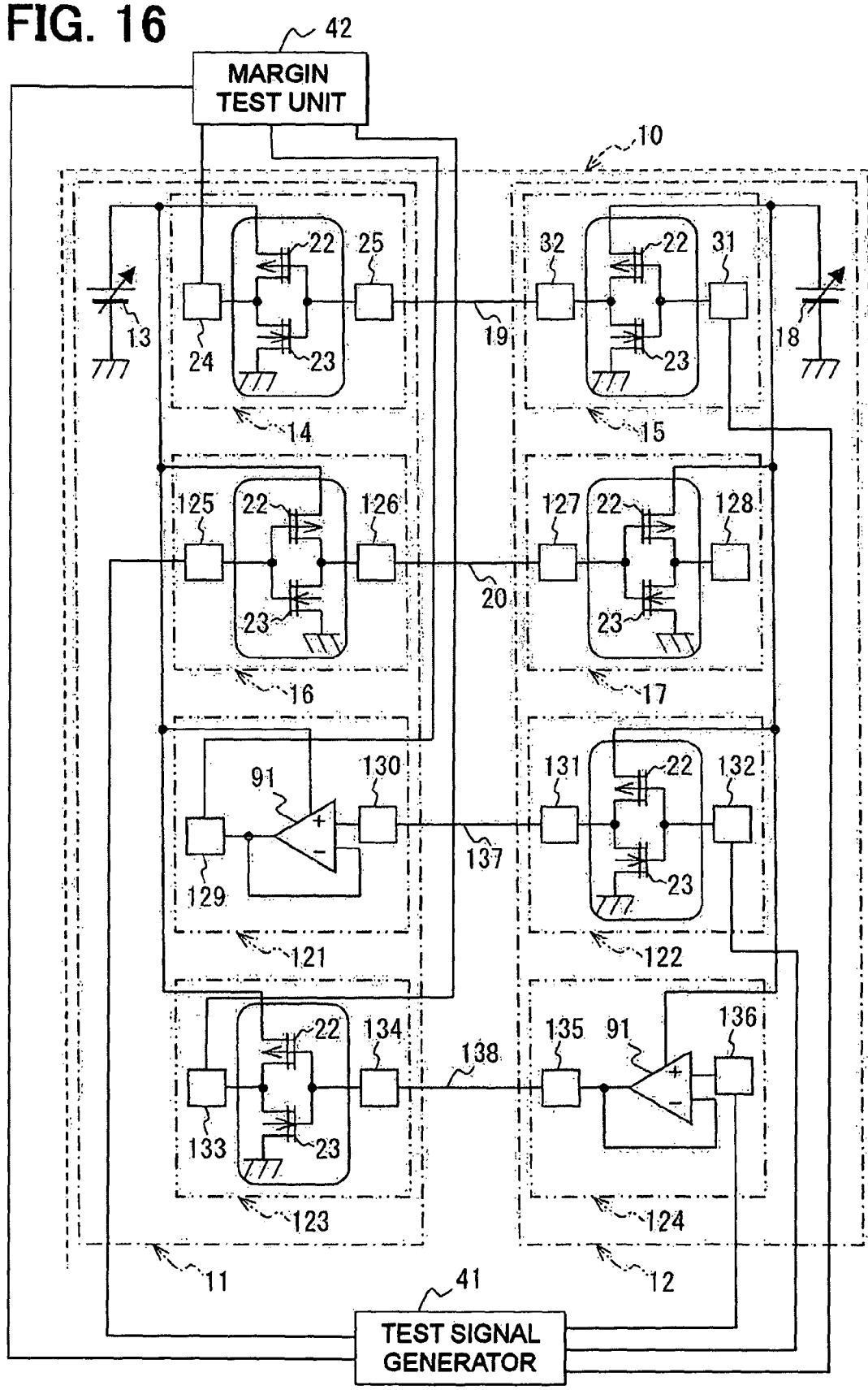
FIG. 16 is an electronic circuit formed on a circuit board according to the seventh embodiment of the invention.

An electronic circuit mounted on a circuit board according to the seventh embodiment will be described with reference to FIGS. 16 and 17.

The IC-1 11 of the electronic circuit according to the seventh embodiment includes a third input circuit 121 and a fourth input circuit 123 in addition to the first power source 13, the first input circuit 14 and the second output circuit 16, and the IC-2 12 includes a third output circuit 122 and a fourth output circuit 124 in addition to the first output circuit 15, the second input circuit 17 and the second power source 18. The first input circuit 14 and the first output circuit 15 are connected by the first wire 19, the second output circuit 16 and the second input circuit 17 are connected by the second wire 20, the third input circuit 121 and the third output circuit 122 are connected by a third wire 137 and the fourth input circuit 123 and the fourth output circuit 124 are connected by a fourth wire 138.

As described above, the first input circuit 14 includes the first test signal output section 24 and the first test signal input section 25 that is connected to the first wire 19. The first output circuit 15 includes the first test signal output section 31 and the first test signal input section 32 that is connected to the first wire 19. In addition, the second input circuit 16 includes a test signal input section 125 and a test signal output section 126. The second output circuit 17 includes a test signal output section 128 and a test signal input section 127. The third input circuit 121 includes a test signal output section 129 and a test signal input section 130. The third output circuit 122 includes a test signal input section 132 and a test signal output section 131. The fourth input circuit 123 includes a test signal output section 133 and a test signal input section 134. The fourth output circuit 124 includes a test signal input section 136 and a test signal output section 135. The test signal input section 25 of the first input circuit 14 is connected to the test signal output section 32 of the first output circuit 15 by the wire 19. The test signal output section 126 of the second output circuit 16 is connected to the test signal input section 127 of the second input circuit by the wire 20. The test signal input section 130 of the third input circuit 121 is connected to the test signal output section 131 of the third output circuit by a wire 137. The test signal input section 134 of the fourth input circuit 123 is connected to the test signal output section 135 by a wire 138.

A margin test on the electronic circuit according to the seventh embodiment will be described below with reference to FIG. 17.

Firstly, the first and second power sources 13, 18 are turned on at S1801. Then, the voltages of the first and second power sources 13, 18 are respectively set to a minimum assurance voltage $V_{1L}$ of the IC-1 11 and a minimum assurance voltage $V_{2L}$ of the IC-2 at S1802. Thereafter, a test signal which includes a Lo signal and a subsequent Hi signal is applied to the test signal input section 31 of the first output circuit 15, the test signal input section 125 of the second output circuit 16, the test signal input section 132 of the third output circuit 122, and the test signal input section 136 of the fourth output circuit 124, at S1803. Then, at S1804, the test signal is monitored at the test signal output section 24 of the first input circuit 14, the test signal output section 128 of the second input circuit 17, the test signal output section 129 of the third input circuit 121 and the test signal output section 133 of the fourth input circuit 123. That is, whether all the output signals of the test signal output sections 24, 128, 129, 133 are or are not the same as the test signal applied to the test signal input sections 31, 125, 132, 136 is examined.

If the result of the examination at S1804 is Y, the step goes to S1805, where the voltage of the first power source 13 is set to a minimum assurance voltage $V_{1L}$ of the IC-1 11, and the voltage of the second power source 18 is set to a maximum assurance voltage $V_{2H}$ of the IC-2 12. At the next step S1806, the test signal is applied to the four test signal input sections 31, 125, 132, 136. At the next step S1807, whether the output signals of the four test signal output sections 24, 128, 129, 133 are or are not the same as the test signal is examined to carry out a branch examination.

If the result of the examination at S1807 is Y, the step goes to S1808, where, the voltages of the first and second power sources 13, 18 are respectively set to a maximum assurance voltage $V_{1H}$ of the IC-1 11 and a minimum assurance voltage $V_{2L}$ of the IC-2. Thereafter, the test signal is applied to the four test signal input sections 31, 125, 132, 136 at S1809. Thereafter, at S1810, whether the output signals of the four test signal output sections 24, 128, 129, 133 are or are not the same as the test signal is examined to carry out a branch examination.

If the result of the examination at S1810 is Y, the step goes to S1811, where the voltage of the first power source 13 is set to a maximum assurance voltage $V_{1H}$ of the IC-1 11, and the voltage of the second power source 18 is set to a maximum assurance voltage $V_{2H}$ of the IC-2 12. At the next step S1812, the test signal is applied to the four test signal input sections 31, 125, 132, 136. At the next step S1813, whether the output signal of the four test signal output sections 24, 128, 129, 133 are or are not the same as the test signal is examined to carry out a branch examination.

If the result of the examination is Y, the step goes to S1814, where it is determined that the margins of the interface between the four input circuits 14, 17, 121, 123 and the four output circuits 15, 16, 122, 124 are sufficient. If the result is N at S1804, S1807, S1810 and S1813, the step goes to S1815, where it is determined that the margins of the interface between the IC-1 11 and IC-2 12 are not sufficient.

Incidentally the order of the voltage settings in the steps S1802, S1805, S1808, S1811 can be changed one from another, and the assurance voltages can be replaced with variable voltage levels by monitoring the voltage of the first test signal output section 24 to detect the threshold value of the CMOS circuit 21.

The examination whether the output signal of the test signal output section is or is not the same as the test signal may be carried out in a different way. For example, an inverting circuit may be incorporated into one of the input and output circuits to determine the sufficiency of the margin if the output signal of the test signal output section is a Hi signal when the test signal is a Lo signal.

Figure 2:
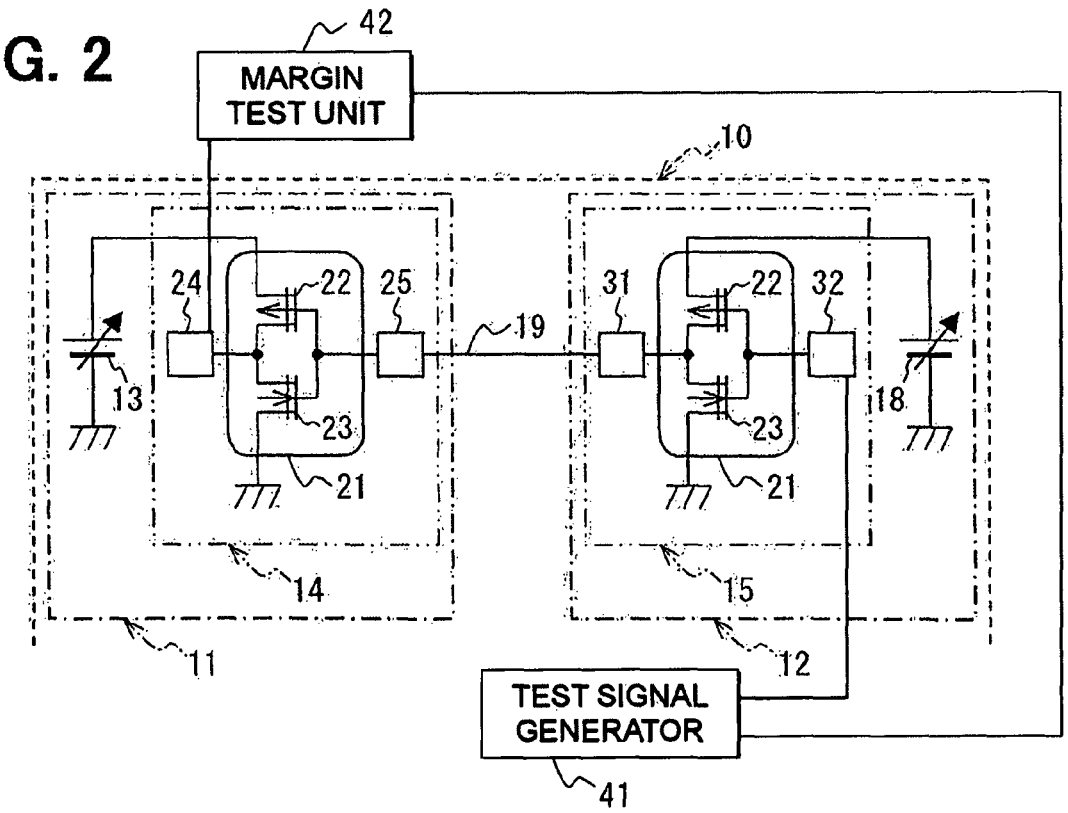
FIG. 2 is an electronic circuit formed on a circuit board according to the first embodiment of the invention.

It is not always necessary to change the voltage of both first power source 13 and the second power source 18. For example, if the voltage of the first power source 13 of the electronic circuit shown in FIG. 2 is changed, the difference in the threshold value of the first input circuit 14 can be examined.

The signal output section or the signal input section can be formed by a pad or a terminal.

If the result of the examination on the electronic circuit according to the first embodiment at the step S404 is N (not the same), it may be determined that the margin of the interface is not sufficient when the voltage of the first power source 13 is set to a minimum assurance voltage $V_{1L}$ and the voltage of the second power source 18 is set to a minimum assurance voltage $V_{2L}$.

In the foregoing description of the present invention, the invention has been disclosed with reference to specific embodiments thereof. It will, however, be evident that various modifications and changes may be made to the specific embodiments of the present invention without departing from the scope of the invention as set forth in the appended claims. Accordingly, the description of the present invention is to be regarded in an illustrative, rather than a restrictive, sense.

What is claimed is:

1. A method of inspecting an electronic circuit including a first integrated circuit and a second integrated circuit formed on a circuit board, the first integrated circuit having a first power source, and an input circuit that has a first test signal output section and a first test signal input section, the second integrated circuit having a second power source, and an output circuit that has a second test signal input section and a second test signal output section connected to the first test signal input section, the method comprising the steps of:
   turning on the first and second power sources at prescribed voltage levels;
   changing voltage level of the first power source;
   applying a test signal to the second signal input section;
   detecting an output signal of the first signal output section; and
   examining whether there is a sufficient margin in the electronic circuit by comparing the test signal and the output signal of the first signal output section.

2. The method of inspection according to claim 1, further comprising the step of changing voltage level of the second power source before applying a test signal to the second signal input section.

3. The method of inspection according to claim 1, wherein the voltage level is changed within a range between a maximum assurance voltage and a minimum assurance voltage.

4. The method of inspection according to claim 3, the margin is determined sufficient if the result of comparing the test signal and the output signal is within a preset value as long as the voltage levels of the first and the second power sources are set within the range between the minimum assurance voltage and the maximum assurance voltage.

5. A method of inspecting an electronic circuit including a first integrated circuit and a second integrated circuit formed on a circuit board, the first integrated circuit having a first power source, an input circuit and a signal output section, and the second integrated circuit having a second power source, an output circuit and a signal input section, the method comprising the steps of:
   turning on the first and second power source;
   setting the voltage levels of the first and the second power source respectively to a minimum assurance voltage $V_{1L}$ and a maximum assurance voltage $V_{2H}$;
   applying a test signal to the signal input section;
   detecting an output signal of the signal output section;
   examining whether the test signal and the output signal are the same or not; and determining there is not a sufficient margin if the test signal and the output signal are not the same.

6. The method of inspection according to claim 5, further comprising, after the step of examining, the steps of:

setting the voltage levels of the first and the second power source respectively to a maximum assurance voltage $V_{1H}$ and a minimum assurance voltage $V_{2L}$;

applying a test signal to the signal input section;

detecting an output signal of the signal output section;

examining whether the test signal and the output signal are the same or not; and determining there is a sufficient margin if the test signal and the output signal are the same.

7. A method of inspecting an electronic circuit including a first integrated circuit and a second integrated circuit formed on a circuit board, the first integrated circuit having a first power source, a plurality of input circuits and their signal output sections, and the second integrated circuit having a second power source, a plurality of output circuits and their signal input sections, the method comprising the steps of:

turning on the first and second power source;

setting the voltage levels of the first and the second power source respectively to a minimum assurance voltage $V_{1L}$ and a minimum assurance voltage $V_{2L}$;

applying a test signal to the signal input sections;

detecting output signals of the signal output sections;

examining whether the test signal and the output signals are the same or not;

determining there is not a sufficient margin if the test signal and the output signals are not the same;

setting the voltage levels of the first and the second power source respectively to the minimum assurance voltage $V_{1L}$ and a maximum assurance voltage $V_{2H}$;

applying a test signal to the signal input sections;

detecting the output signals of the signal output sections;

examining whether the test signal and the output signals are the same or not; and determining there is not a sufficient margin if the test signal and the output signals are not the same;

setting the voltage levels of the first and the second power source respectively to a maximum assurance voltage $V_{1H}$ and the minimum assurance voltage $V_{2L}$;

applying the test signal to the signal input sections;

detecting the output signals of the signal output sections;

examining whether the test signal and the output signals are the same or not; and determining there is not a sufficient margin if the test signal and the output signals are not the same setting the voltage levels of the first and the second power source respectively to the maximum assurance voltage $V_{1H}$ and the maximum assurance voltage $V_{2H}$;

applying the test signal to the signal input sections;

detecting the output signals of the signal output sections;

examining whether the test signal and the output signals are the same or not; and determining there is not a sufficient margin if the test signal and the output signals are not the same or there is a sufficient margin if the test signal and the output signals are the same.

* * * * *